US009184365B2

(12) United States Patent
Limbeck et al.

(10) Patent No.: US 9,184,365 B2
(45) Date of Patent: Nov. 10, 2015

(54) THERMOELECTRIC DEVICE

(75) Inventors: Sigrid Limbeck, Much (DE); Rolf Brück, Bergisch Gladbach (DE)

(73) Assignee: EMITEC Gesellschaft fuer Emissionstechnologie mbH, Lohmar (DE)

(*) Notice: Subject to any disclaimer, the term of this patent is extended or adjusted under 35 U.S.C. 154(b) by 238 days.

(21) Appl. No.: 13/213,189

(22) Filed: Aug. 19, 2011

(65) Prior Publication Data

US 2011/0314798 A1 Dec. 29, 2011

Related U.S. Application Data

(63) Continuation of application No. PCT/EP2010/050884, filed on Jan. 27, 2010.

(30) Foreign Application Priority Data

Feb. 19, 2009 (DE) .......................... 10 2009 009 586

(51) Int. Cl.
*F01N 5/02* (2006.01)
*H01L 35/32* (2006.01)

(52) U.S. Cl.
CPC ............... *H01L 35/32* (2013.01); *F01N 5/025* (2013.01); *Y02T 10/16* (2013.01)

(58) Field of Classification Search
CPC ................................. F01N 5/025; H01L 35/32
USPC .................................... 60/275; 136/200–242
See application file for complete search history.

(56) References Cited

U.S. PATENT DOCUMENTS

| 3,231,965 | A | * | 2/1966 | Roes ............................. 136/201 |
| 3,243,869 | A | | 4/1966 | Sandberg, Jr. |
| 3,400,452 | A | * | 9/1968 | Emley ........................... 136/201 |
| 3,650,844 | A | * | 3/1972 | Kendall et al. ................ 136/237 |
| 4,095,998 | A | * | 6/1978 | Hanson ......................... 136/208 |
| 4,946,511 | A | | 8/1990 | Shiloh et al. |
| 5,228,923 | A | * | 7/1993 | Hed ............................... 136/208 |
| 5,563,368 | A | * | 10/1996 | Yamaguchi ................... 136/205 |

(Continued)

FOREIGN PATENT DOCUMENTS

| DE | 669 966 | 1/1939 |
| DE | 19946700 A1 | 6/2000 |

(Continued)

OTHER PUBLICATIONS

International Search Report of PCT/EP2010/050884, Dated May 20, 2011.

*Primary Examiner* — Kenneth Bomberg
*Assistant Examiner* — Brandon Lee
(74) *Attorney, Agent, or Firm* — Laurence A. Greenberg; Werner H. Stemer; Ralph E. Locher

(57) ABSTRACT

A thermoelectric device contains at least one module having a first carrier layer and a second carrier layer, an interspace disposed between the first carrier layer and the second carrier layer, and an electrical insulation layer disposed on each of the first carrier layer and on the second carrier layer toward the interspace. The thermoelectric device further has a plurality of p and n-doped semiconductor elements, which are arranged alternately in the interspace between the insulation layers and are alternately electrically connected to one another.

12 Claims, 4 Drawing Sheets

(56) References Cited

U.S. PATENT DOCUMENTS

| | | | |
|---|---|---|---|
| 6,096,966 A * | 8/2000 | Nishimoto et al. | 136/205 |
| 6,194,816 B1 * | 2/2001 | Wakabayashi et al. | 310/348 |
| 6,252,154 B1 | 6/2001 | Kamada et al. | |
| 7,100,369 B2 * | 9/2006 | Yamaguchi et al. | 60/324 |
| 2002/0069907 A1 * | 6/2002 | Yamashita | 136/205 |
| 2005/0241690 A1 * | 11/2005 | Tajima et al. | 136/212 |
| 2007/0221264 A1 * | 9/2007 | Shutoh et al. | 136/224 |
| 2008/0223427 A1 * | 9/2008 | Ohno | 136/238 |

FOREIGN PATENT DOCUMENTS

| | | |
|---|---|---|
| DE | 10 2006 039 024 A1 | 2/2008 |
| GB | 874 660 | 8/1961 |
| JP | H0529667 A | 2/1993 |
| JP | H05299704 A | 11/1993 |
| JP | H07106642 A | 4/1995 |
| JP | 2000232244 A | 8/2000 |
| JP | 2003273410 A | 9/2003 |
| JP | 2003282972 A | 10/2003 |
| JP | 2004153128 A | 5/2004 |
| JP | 2006138296 A | 6/2006 |
| JP | 2006190916 A | 7/2006 |
| JP | 2006294738 A | 10/2006 |
| JP | 2007150112 A | 6/2007 |
| JP | 2008277584 A | 11/2008 |
| RU | 2158988 C1 | 11/2000 |

* cited by examiner

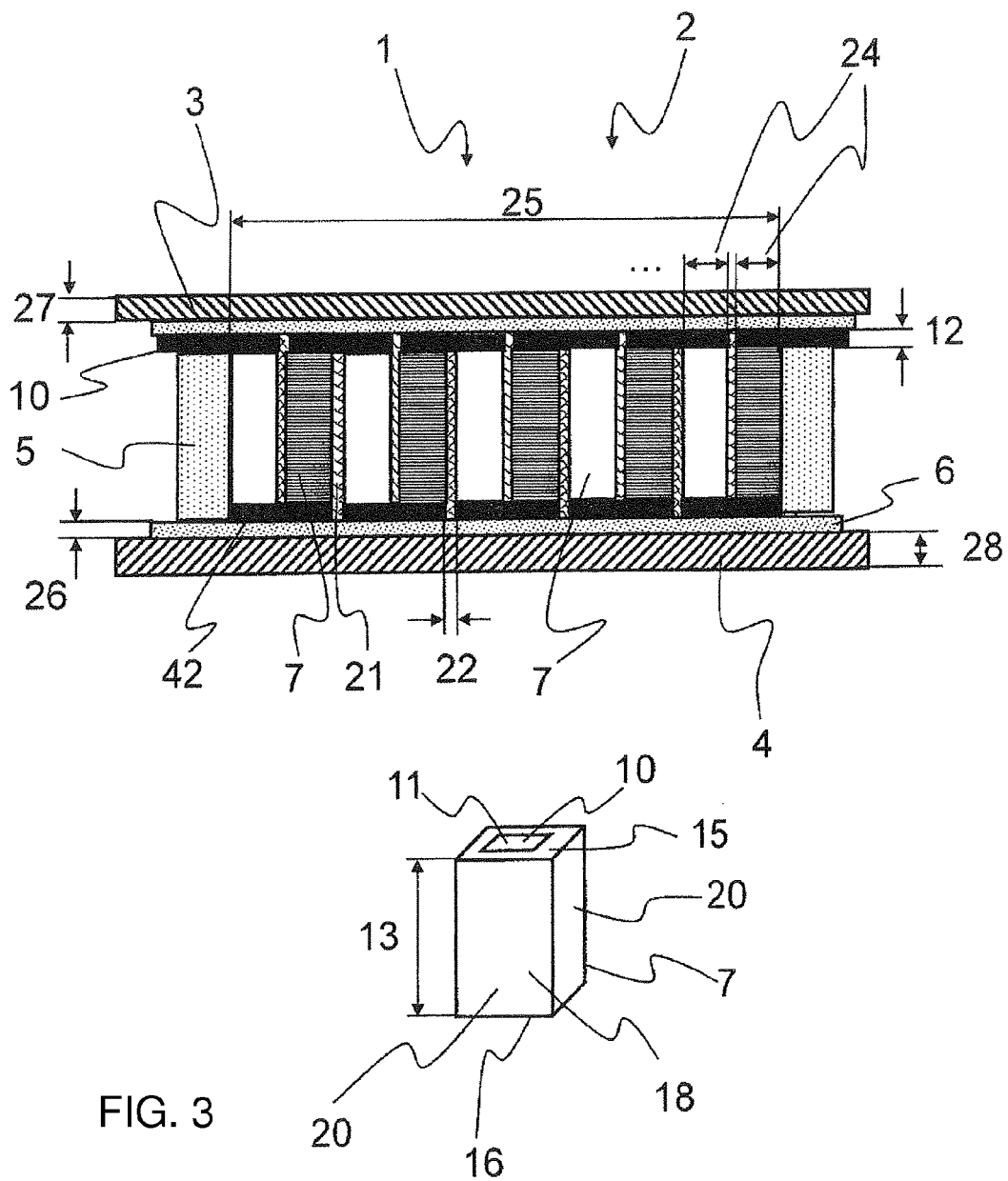

THERMOELECTRIC DEVICE

CROSS-REFERENCE TO RELATED APPLICATION

This is a continuation application, under 35 U.S.C. §120, of copending international application No. PCT/EP2010/050884, filed Jan. 27, 2010, which designated the United States; this application also claims the priority, under 35 U.S.C. §119, of German patent application No. DE 10 2009 009 586.1, filed Feb. 19, 2009; the prior applications are herewith incorporated by reference in their entirety.

BACKGROUND OF THE INVENTION

Field of the Invention

The present invention relates to a thermoelectric device for generating electrical energy, e.g. from the exhaust gas of an internal combustion engine, by a generator. This is taken to mean, in particular, a generator for converting thermal energy of an exhaust gas into electrical energy, that is to say a so-called thermoelectric generator.

The exhaust gas from an engine of a motor vehicle has thermal energy, which can be converted into electrical energy by a thermoelectric generator or apparatus in order, for example, to fill a battery or some other energy store or to directly feed the required energy to electrical loads. The motor vehicle is thus operated with a better energy efficiency, and energy is thus available to a greater extent for the operation of the motor vehicle.

Such a thermoelectric generator contains at least a plurality of thermoelectric converter elements. Thermoelectric materials are of a type such that they can effectively convert thermal energy into electrical energy (Seebeck effect), and vice versa (Peltier effect). The "Seebeck effect" is based on the phenomenon of the conversion of thermal energy into electrical energy and is utilized for generating thermoelectric energy. The "Peltier effect" is the reverse of the "Seebeck effect" and a phenomenon which is accompanied by heat adsorption and is caused in relation to a current flow through different materials. The "Peltier effect" has already been proposed for thermoelectric cooling, for example.

Such thermoelectric converter elements preferably have a multiplicity of thermoelectric elements positioned between a so-called hot side and a so-called cold side. Thermoelectric elements contain e.g. at least two semiconductor parallelepipeds (p-and n-doped) which are alternately provided with electrically conductive bridges on their top side and underside (toward the hot side and cold side, respectively). Ceramic plates or ceramic coatings and/or similar materials serve for insulating the metal bridges and are therefore preferably arranged between the metal bridges. If a temperature gradient is provided on both sides of the semiconductor parallelepipeds, then a voltage potential forms. On the hot side of the first semiconductor parallelepiped, heat is absorbed in this case, wherein the electrons of one side pass to the energetically higher conduction band of the following parallelepiped. On the cold side, the electrons can now liberate energy and pass to the following semiconductor parallelepiped with a lower energy level. Consequently, an electric current flow can be established given a corresponding temperature gradient.

It has already been attempted to provide corresponding thermoelectric generators for application in motor vehicles, in particular passenger cars. However, these have mainly been very expensive to produce and characterized by a relatively low efficiency. Therefore, it has not yet been possible to attain suitability for series production. Moreover, it has been possible to determine that the known thermoelectric generators usually demand very large structural space and can therefore be integrated into existing exhaust gas systems only with difficulty.

SUMMARY OF THE INVENTION

Taking this as a departure point, it is an object of the present invention to solve at least in part the problems outlined with regard to the prior art. In particular, the intention is to specify a thermoelectric device which is suitable for diverse cases of use which enables an improved efficiency with regard to the conversion of thermal energy provided into electrical energy. In this case, the thermoelectric device is intended to be suitable for being adapted to different power requirements as flexibly as possible.

The thermoelectric device according to the invention contains at least one module having a first carrier layer and a second carrier layer, an interspace between the first carrier layer and the second carrier layer, an electrical insulation layer on the first carrier layer and on the second carrier layer toward the interspace, and a plurality of p and n-doped semiconductor elements, which are arranged alternately in the interspace between the insulation layers and are alternately electrically connected to one another.

The thermoelectric device proposed here is assembled in particular in layered or layer-like fashion with, in particular, a plurality of (identical) modules to form a thermoelectric generator. In particular, a plurality of interconnected modules form a thermoelectric device. In this case, the thermoelectric device is arranged, in particular, in a housing in which a plurality of thermoelectric devices can also be arranged together as a structural unit for forming a thermoelectric generator. The thermoelectric device has, in addition to the module, in particular, sealing device that close up the interspace toward the outside, and also connection elements for producing an electric circuit, which can conduct the electric current generated in the module to a store or load of a motor vehicle.

The semiconductor elements are arranged in particular alongside one another between two carrier layers, which in particular form the outer boundary of the thermoelectric device. In this case, the outer carrier layers primarily form a heat transfer layer that enables heat transfer from the thermoelectric device to the fluids flowing around the thermoelectric device. In this case, the first/second carrier layer is thermally conductively connected to a so-called hot side, in particular a fluid having an elevated temperature, and the other (second/first) carrier layer is thermally conductively connected to a cold side, in particular to a fluid having a low temperature. As a result, a thermal potential between the carrier layers is formed by the thermoelectric device, the potential, on account of the "Seebeck effect", generating an electric current through the semiconductor elements that are alternately connected to one another. The carrier layers are constructed in particular at least partly from steel and/or aluminum.

An interspace is provided between the carrier layers, the semiconductor elements being arranged in the interspace. The interspace thus has in particular only an extent which is substantially only predetermined by a height and a number and also by the arrangement of the semiconductor elements.

In order to realize a targeted current flow through the p and n-doped semiconductor elements, the carrier layers have at least in part an electrical insulation layer, on which the semiconductor elements are fixed and electrically connected to one another. In particular, an aluminum oxide layer is appropriate as an insulation layer. With respect to the electrical insulation layer, care should be taken to ensure that it does not excessively impede the heat transfer from an outer side of the carrier layer toward the semiconductor elements. That can also be achieved, in particular, by the electrical insulation layer actually only being provided in the region of the contact area of the semiconductor elements with the carrier layer. At all events, such an electrical insulation layer should be embodied in a sufficiently impermeable fashion such that it is not permeable to the means for electrically interconnecting the semiconductor elements, and the electrical insulation layer reliably prevents electrically conductive connections toward the carrier layer and/or toward adjacent current paths. In particular, different electrical insulation layers are possible in the case of the first and second carrier layers.

By way of example bismuth tellurite ($Bi_2Te_3$) can be used as conductive materials for the p-doped and n-doped semiconductor elements. Furthermore, the following materials could be used [up to the following maximum temperatures in °C.]:

| n-type: | | |
|---|---|---|
| | $Bi_2Te_3$ | [approx. 250° C.]; |
| | PbTe | [approx. 500° C.]; |
| | $Ba_{0.3}Co_{3.95}Ni_{0.05}Sb_{12}$ | [approx. 600° C.]; |
| | $Ba_y(Co,Ni)_4Sb_{12}$ | [approx. 600° C.]; |
| | $CoSb_3$ | [approx. 700° C.]; |
| | $Ba_8Ga_{16}Ge_{30}$ | [approx. 850° C.]; |
| | $La_2Te_3$ | [approx. 1100° C.]; |
| | SiGe | [approx. 1000° C.]; |
| | $Mg_2(Si,Sn)$ | [approx. 700° C.]; |

| p-type: | | |
|---|---|---|
| | $(Bi,Sb)_2Te_3$ | [approx. 200° C.]; |
| | $Zn_4Sb_3$ | [approx. 380° C.]; |
| | TAGS | [approx. 600° C.]; |
| | PbTe | [approx. 500° C.]; |
| | SnTe | [approx. 600° C.]; |
| | $CeFe_4Sb_{12}$ | [approx. 700° C.]; |
| | $Yb_{14}MnSb_{11}$ | [approx. 1000° C.]; |
| | SiGe | [approx. 1000° C.]; |
| | $Mg_2(Si,Sb)$ | [approx. 600° C.]. |

In the case of this thermoelectric device, therefore, the two carrier layers are utilized for delimiting the interspace and for a heat transfer toward the semiconductor elements. In this case, the semiconductor elements can be provided for example in the manner of small parallelepipeds and/or small elongate rods composed of material having different electrical conductivities. Two different semiconductor elements (p-doped and n-doped) respectively are electrically connected to one another in such a way that together they produce a series circuit. One of the two carrier layers absorbs the inflowing heat flow (hot side), while the other carrier layer emits the outflowing heat flow (cold side). With regard to the design of the arrangement and/or interconnection of the individual semiconductor elements, the type and/or shape and/or position of the semiconductor elements can be adapted to the structural space, the heat flow rate, the current conduction, etc., wherein they can, in particular, also differ in this case. In particular, the thermoelectric device has one or more groups of semiconductor elements connected in series with one another, wherein the groups in each case have mutually independent electric circuits or are connected to one another by an electrical parallel circuit.

In accordance with one development of the thermoelectric device, the material for the at least one carrier layer contains a plastic. Here it is possible to use, in particular, plastics which also have metallic inclusions for improving the heat conduction. In particular, plastics which are suitable for temperature ranges of 200 to 390° C. and have a high fatigue strength are mentioned here. Preferably, the plastics can have, on their outer surface (facing away from the interspace), a coating embodied, in particular, being resistant to a corrosive medium flowing over the carrier layer. The use of plastic is advantageous here, in particular, since plastics can be provided cost-effectively, can be produced flexibly, can be adapted flexibly to different requirements and can be produced and processed by a wide variety of manufacturing methods. In particular, polyether ketones (e.g. PEKK) are proposed here as plastic for use for the carrier layers, since they are resistant to high temperatures and have melting points of above 300° C. and at the same time are resistant to many organic and inorganic chemicals. Therefore, they can be used as carrier layers in particular also without additional coating.

In accordance with a further advantageous configuration of the thermoelectric device, at least a portion of the semiconductor elements is configured in annular fashion and each is connected to the electrical insulation layer by an outer circumferential area and an inner circumferential area. The term "in annular fashion" thus means that the semiconductor element forms at least one section of an annulus. Semiconductor elements shaped in this way are to be proposed, in particular, for at least partly tubular thermoelectric devices. In this case, the carrier layers form the outer circumferential area and the inner circumferential area of a tube, such that a double tube wall is formed, in the interspace of which the semiconductor elements are arranged. In a thermoelectric device constructed in this way, one fluid flows through a channel formed by the inner circumferential area of the tube and another fluid flows over the device on the outer circumferential area, such that a thermal potential can be generated across the double tube wall. The semiconductor elements are arranged within the double tube wall and embodied in particular in a circumferentially closed manner in the form of an annulus. The semiconductor elements can, in particular, also have the shape of an annulus segment. Here, too, the semiconductor elements are arranged alongside one another or one behind another along an axial direction of the tube. An annular or annulus-segment-shaped configuration of the semiconductor elements is preferred since, between cylindrical or parallelepiped semiconductor elements arranged alongside one another on a curved area, gaps between the semiconductor elements are produced which expand in a radial direction and this results in a smaller utilization of the volume of the interspace. In this case, the annular shape can correspond, in particular, to a circular shape, but oval embodiments are possible. With regard to the interconnection it is here for example also possible for the semiconductor elements to have a 180° annular shape, which are then electrically connected to one another in an offset/alternating manner.

In accordance with one advantageous development of the thermoelectric device, the p and n-doped semiconductor elements are electrically connected to one another by a solder material on the electrical insulation layer and at least one of the following conditions is met:
a) the p and n-doped semiconductor elements each have current transfer areas of the same size;
b) the solder material has a solder thickness and the ratio of a height of the semiconductor elements to the solder thickness is greater than 5:1; and
c) the solder material is an element from the group active solder, silver solder.

It is preferably the case here that the soldering points or soldering areas serving for fixing the semiconductor elements does not exceed the contact area of the semiconductor elements with the insulation layer. The solder material is preferably applied by an adhesive being printed onto the electrical insulation layer at the desired locations in order to subsequently bring the carrier layers into contact with pulverulent solder material which adheres to these predetermined adhesive locations. In this case, the granulation of the solder material should be chosen such that the amount of solder material made available is precisely sufficient for the desired contact area formed by the solder material to be formed. In this case, the semiconductor elements have on each of their contact areas current transfer areas of identical size which are defined by those regions of the contact areas of the semiconductor element which are provided with solder material. As far as possible identical contact resistances between the semiconductor elements and the solder materials functioning as a conductor track are achieved as a result. Particularly in the case of semiconductor elements configured in annular fashion or in annulus-segment-shaped fashion and also in the case of semiconductor elements having contact areas of different sizes, provision is made for providing current transfer areas of identical size. In this case, the outer circumferential area of the semiconductor element is regularly larger than the inner circumferential area. Accordingly, the outer current transfer areas can be made narrower than the current transfer areas arranged at the inner circumferential area of the semiconductor elements. This is advantageous, in particular, for the process for producing the thermoelectric device, in which the positioning of the conductor tracks on one carrier layer is coordinated with the conductor tracks on the other carrier layer in such a way that an alternate electrical connection of the semiconductor elements is achieved, such that a series circuit can be produced by the thermoelectric device. The reduction thus possible in the width of the current transfer area therefore makes it possible to widen the manufacturing tolerances in the production of the conductor tracks by applying solder material and in the mounting of the individual components. It is thus possible to significantly reduce production faults and production costs in the production of the thermoelectric device proposed.

The semiconductor elements used preferably have a height of 1 to 5 mm. This leads to a particularly compact configuration of the thermoelectric device and also ensures a sufficient temperature difference between the carrier layers across the interspace. All of the semiconductor elements will regularly have the same height. In this case, the ratio of the height of the semiconductor elements to the solder thickness is in particular more than 10 to 1, preferably more than 20 to 1, and particularly preferably more than 50 to 1. The limitation of the solder thickness likewise fosters a compact design of the thermoelectric device.

Preferably, the solder material should be chosen from the group active solder, silver solder and, in particular, from the solder materials in accordance with the European standard EN 1044: 1999: AG301, AG302, AG303, AG304, AG305, AG306, AG307, AG308, AG309, AG351, AG401, AG402, AG403, AG501, AG502, AG503, AG101, AG102, AG103, AG104, AG105, AG106, AG107, AG108, AG201, AG202, AG203, AG204, AG205, AG206, AG207, AG208. If appropriate, taking account of the application, it is also possible, of course, to use other high-temperature-resistant solders coordinated with the semiconductor materials.

In accordance with one advantageous development of the thermoelectric device, a first contact area between the first carrier layer and the semiconductor element and a second contact area between the second carrier layer and the semiconductor element via the electrical insulation layer differ in size and have a ratio of first contact area to second contact area of up to 1:3. In this case, the first contact area and the second contact area are in each case defined as the area of the semiconductor element which is connected to the first and second carrier layer, respectively, via the electrical insulation layer or via the solder material. The different embodiment of the first and second contact areas likewise enables a high productivity in the manufacture of the thermoelectric device. The area of the semiconductor element that is provided for making contact to the solder material is increased as a result, and so manufacturing tolerances can be made more generous and, accordingly, reliable and fault-free production of the thermoelectric device is ensured. In particular, in this case, with a tubular configuration of the module, a semiconductor element has a larger outer contact area. The semiconductor elements can accordingly have an outwardly expanding shape (in particular a conicity) which ensures such a different contact area. Furthermore, such a condition can be met by the annular or annulus-segment-shaped embodiment of the semiconductor element. In particular, the larger contact area is regularly arranged at the carrier layer over which a gas stream flows. In the case of the arrangement of the thermoelectric device in a motor vehicle, wherein the first carrier layer is connected to a hot side and an exhaust gas stream thus flows over it, and in which the second carrier layer is connected to a cold side and, in particular, a cooling liquid flows over it, the first contact area should be embodied as larger than the second contact area. This is substantiated by the higher heat transfer resistance at the first carrier layer, over which the gas stream flows. The second carrier layer, over which the cooling liquid flows, can conduct the heat better, such that here the smaller second contact area can be provided.

In accordance with a further advantageous configuration, a useful volume of the module is defined as a ratio of the sum of the volume of the semiconductor elements in the module to an encapsulated volume of the module and the useful volume is greater than 90%. The encapsulated volume of the module is defined, in particular, by the outer carrier layers and, if appropriate, further walls of the thermoelectric device or of the module. Preferably, therefore, the interspace between the carrier layers should be filled as completely as possible by the semiconductor elements. The useful volume should therefore be, in particular, greater than 95%, preferably greater than 98%. This is achieved, in particular, by means of ring-shaped semiconductor elements which have no separating planes in the circumferential direction and accordingly enable a high useful volume of the thermoelectric device or of the module.

In accordance with a further advantageous development of the thermoelectric device, the semiconductor elements have an electrical insulation on side areas facing one another, wherein the electrical insulation is formed, in particular, by a layer composed of mica or ceramic. The term mica denotes the group of phyllosilicates. In this case, gaps between the semiconductor elements are filled by mica or ceramic in the form of filling material or in the form of a coating. Preferably, this insulation can already be applied to the semiconductor elements before the assembly process of the thermoelectric device, such that the semiconductor elements can be arranged with a high packing density on the carrier layers or electrical insulation layers and are supported against one another. An air gap between the semiconductor elements, which air gap is known from the prior art and can be established only with difficulty in terms of production engineering, is therefore not necessary here. The insulation of the semiconductor elements among one another is thus effected here by a separate layer, such that the semiconductor elements are electrically connected to one another in the form of the series circuit exclusively via the solder materials. In this case, it is particularly advantageous for the insulation between the side areas of the semiconductor elements to have an insulation width of less than 50 μm, preferably less than 20 μm, and particularly preferably less than 5 μm. This measure also leads to a compact design of the thermoelectric device and likewise to simplified production.

In accordance with a further advantageous configuration of the thermoelectric device, a degree of area utilization of the module is defined as the ratio of the area of the first and second carrier layers which is coated with semiconductor elements to a total area of the first and second carrier layers which is coatable with semiconductor elements and the degree of area utilization of the module is greater than 85%. This parameter, too, is intended to define, in particular, the most compact design possible of the thermoelectric device or of the module. In this case, the coatable total area of the first and second carrier layers is limited by the semiconductor elements arranged at the outer edges and thus takes account of the electrically insulating gaps present between the semiconductor elements. The degree of area utilization of the module should be embodied as, in particular, greater than 95% and, in particular, greater than 98%.

In accordance with a further advantageous development of the thermoelectric device, the electrical insulation layer between at least one of the carrier layers and the semiconductor element has an insulation layer thickness of less than 70 μm. In particular, this insulation layer thickness should be embodied as less than 50 μm, and particularly preferably less than 20 μm.

In accordance with a further advantageous configuration of the thermoelectric device, the ratio of a height of the semiconductor elements to an insulation layer thickness of the electrical insulation layer is greater than 8:1, preferably greater than 80:1, and particularly preferably greater than 100:1. This parameter also clarifies the high utilization of the existing volume of the thermoelectric device for the arrangement of semiconductor elements, thus providing a thermoelectric device that is as effective as possible.

In accordance with a further advantageous configuration of the thermoelectric device, the first carrier layer has a first thickness of between 20 μm and 500 μm, preferably between 40 μm and 250 μm. In this case, the first carrier layer is arranged on the hot side, in particular, during the operation of the thermoelectric device.

In particular, only the first carrier layer has at least one axial compensation element which compensates for a thermal expansion of the module in an axial direction. The axial compensation element can be embodied e.g. in the manner of bellows or in accordance with a wavelike protuberance, such that compression or expansion is made possible in this region and the different thermal expansion between the first carrier layer (hot side) and the second carrier layer (cold side), the different thermal expansion being brought about on account of the temperature difference, is thus compensated for.

In particular, it is provided that the second carrier layer has a second thickness of between 200 μm and 1.5 mm, in particular between 400 μm and 1.2 mm. This second thickness made significantly thicker than the first thickness ensures the dimensional stability of the thermoelectric device or of the module.

Particular preference is given to a thermoelectric device at least containing at least one module having a first carrier layer and a second carrier layer, an interspace between the first carrier layer and the second carrier layer, an electrical insulation layer on the first carrier layer and on the second carrier layer toward the interspace, a plurality of p and n-doped semiconductor elements, which are arranged alternately in the interspace between the insulation layers and are alternately electrically connected to one another, wherein at least one of the features explained above is present.

The ratio of the sum of the volume of the semiconductor elements in the module to an encapsulated volume of the module leads to a useful volume of greater than 90%.

An electrical insulation is formed by a layer or coating composed of mica or ceramic.

A gap between the semiconductor elements is less than 50 μm.

The ratio of the height of the semiconductor elements to the insulation layer thickness is greater than 8:1.

The solder material has a solder thickness and the ratio of a height of the semiconductor elements to the solder thickness is greater than 5:1.

It is also particularly preferred for at least 3 or even all of the above features to be realized in combination with one another. The above order is currently regarded as an indication of the relevance of the features for improving known devices.

Advantageously, the second carrier layer contains a material having a higher thermal conductivity than the first carrier layer, such that the second carrier layer nevertheless exhibits comparable heat dissipation despite the larger second thickness.

In accordance with a further advantageous development of the thermoelectric device, a plurality of axial compensation elements are provided at distances of in each case at most 10 mm in an axial direction.

In accordance with a further advantageous configuration, at least one module has at least one axial compensation element which is formed by at least a plurality of semiconductor elements arranged obliquely in an axial direction, such that a thermal expansion of the module in an axial direction is at least partly converted into a thermal expansion in a radial direction. As a result of the semiconductor elements being positioned obliquely in an axial direction, it is possible, on account of a different thermal expansion of the first carrier layer in comparison with the second carrier layer, for a relative movement of these carrier layers to be compensated for by a change in the oblique position of the semiconductor elements. As a result, a radial expansion is brought about instead of a change in the length of the module on one side. In this case, the at least plurality of semiconductor elements are arranged obliquely in the axial direction at least while the thermoelectric device is out of operation. During operation, the semiconductor elements straighten up on account of the axial thermal expansion in such a way that the semiconductor elements are arranged, in particular, perpendicularly to the carrier layers or the axial direction. This radial thermal expansion can lead to a restriction of a cross section which adjoins the outer carrier layers and through which a fluid flows, wherein a control of the fluid volumetric flow rate along the carrier layers likewise becomes possible as a result. Accordingly, fluid flows in a thermoelectric generator with a multiplicity of thermoelectric devices and a plurality of channels through which a fluid flows or carrier layers over which a fluid flows can be controlled in particular in a self-regulating manner, so that a uniform distribution of the available thermal power in the fluid flow over all available surfaces of the thermoelectric devices is ensured or fostered.

In accordance with a further advantageous development, the compensation of the thermal expansion is brought about by materials for the carrier layers which have different coefficients of thermal expansion. The carrier layer of the hot side has a correspondingly low coefficient of thermal expansion and the carrier layer of the cold side has a corresponding high coefficient of thermal expansion.

A further particularly preferred configuration of the thermoelectric device provides that at least a plurality of modules can be connected to one another in an axial direction. This enables the thermoelectric device to be adapted to previously defined power requirements. This has advantages in particular for the production and provision of thermoelectric devices for the different applications. In this case, the modules are interconnected in particular at least by means of a solder connection to one another, wherein, in particular, mutually insulated electrical conductor tracks are to be provided which enable an electrical series connection of the semiconductor elements of the individual modules. In particular, in this case a fluid-tight interconnection of the individual modules is also to be produced, such that, in particular, surrounding media having a corrosive effect, e.g. an exhaust gas, cannot penetrate into the regions between two modules. In particular, a tubular configuration of the modules is preferable for this connection of at least a plurality of modules.

Advantageously, a module can have a filler that seals the interspace between the carrier layers with respect to surrounding media or fluids, in particular a cooling circuit or an exhaust gas. In particular, the carrier layers can also seal the interspace by virtue of the first carrier layer and the second carrier layer forming a (direct) connection to one another. In the case of an arrangement of a plurality of modules one behind another, however, preferably, first carrier layers are connected to first carrier layers and/or second carrier layers are connected to second carrier layers, such that the electrical conductor tracks within each individual module can be connected to the conductor tracks of the adjacent module, without a carrier layer having to be penetrated by a conductor track.

In accordance with a further advantageous configuration, a thermoelectric apparatus has a plurality of thermoelectric devices according to the invention, wherein the first carrier layer is connected to a hot side and the second carrier layer is connected to a cold side.

Especially preferably, a motor vehicle containing an internal combustion engine, an exhaust gas system, a cooling circuit and a plurality of thermoelectric devices according to the invention is provided here, wherein the first carrier layer is connected to a hot side and the second carrier layer is connected to a cold side, and wherein, in the motor vehicle, the exhaust gas system is connected to the hot side and the cooling circuit is connected to the cold side.

Other features which are considered as characteristic for the invention are set forth in the appended claims.

Although the invention is illustrated and described herein as embodied in a thermoelectric device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 2 is an illustration showing an embodiment variant of a module of the thermoelectric device;

FIG. 3 is a diagrammatic, perspective view of an embodiment variant of a semiconductor element;

DETAILED DESCRIPTION OF THE INVENTION

Figure 1:
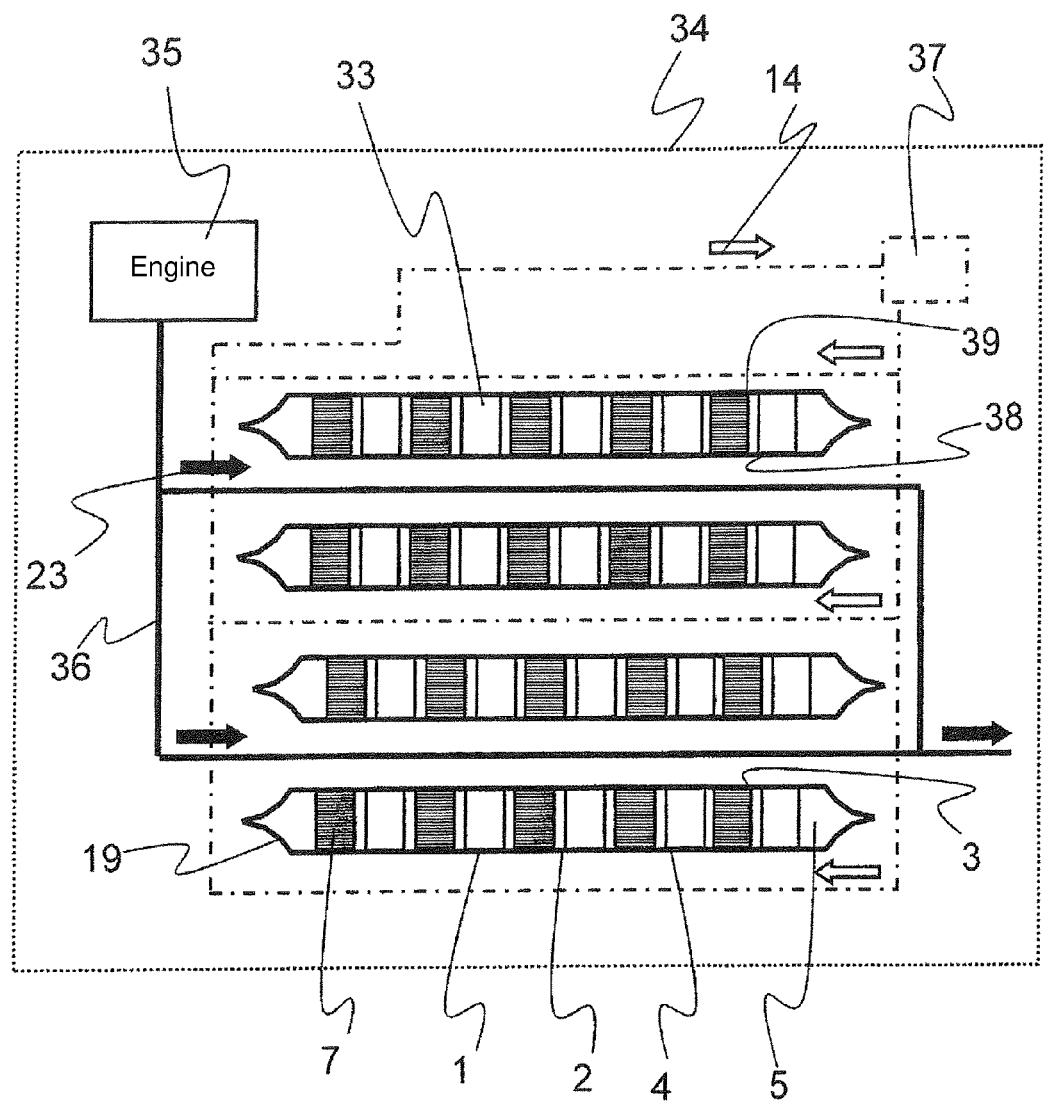
FIG. 1 is an illustration showing an embodiment variant of a thermoelectric apparatus in a motor vehicle according to the invention.

FIG. 1 shows an embodiment variant of a thermoelectric apparatus 33 in a motor vehicle 34 containing an internal combustion engine 35 and an exhaust gas system 36, in which a second fluid 23, in particular an exhaust gas, having an elevated temperature flows through the thermoelectric apparatus 33. The thermoelectric apparatus 33 has a multiplicity of thermoelectric devices 1 containing modules 2. The second fluid 23 flows over the modules 2 on a hot side 38 and a first fluid 14 flows over the modules on a cold side 39, the first fluid being assigned to a cooling circuit 37. The hot side 38 of the thermoelectric device 1 is delimited by a first carrier layer 3 of the module 2. Likewise, the cold side 39 is delimited by a second carrier layer 4 of the module 2. Semiconductor elements 7 are arranged in the interspace 5 between the first carrier layer 3 and the second carrier layer 4. Furthermore, FIG. 1 shows an encapsulated volume 19 of a module 2, which is delimited or enclosed here by the first carrier layer 3 and the second carrier layer 4.

FIG. 2 shows a detail of an embodiment variant of the module 2 of the thermoelectric device 1. In this case, the module 2 is illustrated with the first carrier layer 3 and the second carrier layer 4, which between them have an interspace 5, in which the semiconductor elements 7 are arranged alternately as n and p-doped semiconductor elements. The semiconductor elements 7 are alternately electrically connected to one another by solder material 10, thus resulting in a series circuit formed by the n and p-doped semiconductor elements. The solder material 10 here has a solder thickness 12. The solder material 10 is spaced apart from the first carrier layer 3 and the second carrier layer 4, respectively, by an electrical insulation layer 6 having an insulation layer thickness 26. The first carrier layer 3 here has a first thickness 27, which, in particular, is embodied smaller than a second thickness 28 of the second carrier layer 4. Arranged between the semiconductor elements 7 is an insulation 21 having an insulation width 22 which is intended to prevent the electrons that flow through the semiconductor elements 7 from crossing over, and accordingly ensures the series connection of the semiconductor elements 7 only via the solder material 10 forming the conductor tracks 42. Furthermore, the module 2 has a total area 25 which is coatable with semiconductor elements 7 and which is delimited by the outermost semiconductor elements 7. By contrast, a coated area 24 is the sum of the area portions of the module 2 which is coated with semiconductor elements 7.

FIG. 3 shows an embodiment variant of the semiconductor element 7. The latter is embodied here in parallelepiped fashion or in the form of a small rod and has a first contact area 15 and a second contact area 16, via which the semiconductor element 7 is connected to the first carrier layer and second carrier layer, respectively, via the electrical insulation layer. Furthermore, the semiconductor element 7 has a current transfer area 11 formed by the contact of the semiconductor element 7 with the solder material 10, by which the individual semiconductor elements 7 within the module 2 are connected to one another in a series circuit. The semiconductor element 7 additionally has side areas 20 which, together with the first and second contact areas 15, 16, delimit a volume 18 of the semiconductor element 7. The semiconductor element 7 additionally has a height 13.

Figure 4:
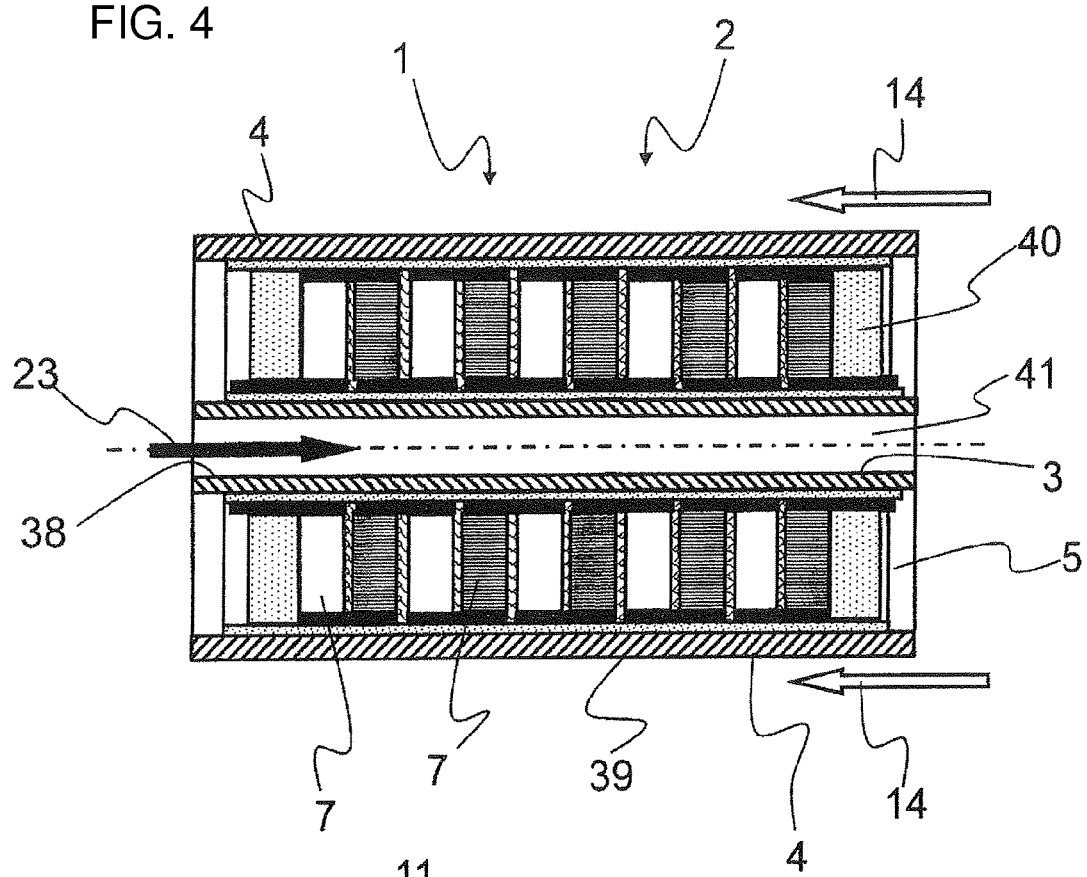
FIG. 4 is an illustration showing a further embodiment variant of the module of the thermoelectric device.

FIG. 4 shows a further embodiment variant of the module 2 of the thermoelectric device 1, a tubular embodiment of the thermoelectric device 1 or of the module 2 being shown here. In particular, the second fluid 23 flows through an inner channel 41 of the tubular module 2. Thus, in the embodiment variant shown here, the inner channel 41 forms the hot side 38 of the thermoelectric device 1. The first fluid 14 flows over the cold side 39 of the thermoelectric device 1, such that a thermal potential forms across the semiconductor elements 7. The inner circumferential area of the tube and hence the inner channel 41 is formed by the first carrier layer 3, while the outer circumferential area of the module 2 is formed here by the second carrier layer 4. For delimiting the interspace 5 and for protection against the ingress of fluids possibly having a corrosive effect, the interspace 5 is sealed by a filling material 40.

Figure 5:
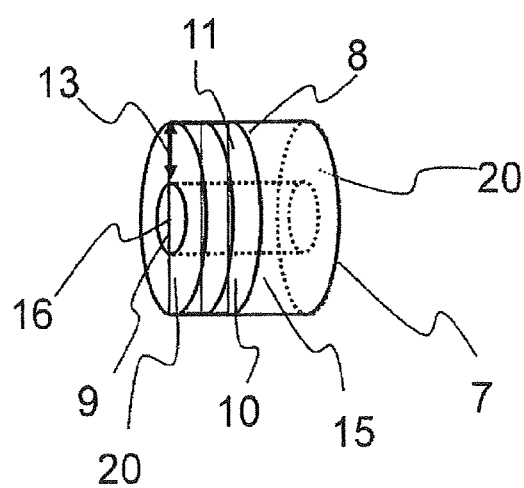
FIG. 5 is a diagrammatic, perspective view showing a further embodiment variant of the semiconductor element.

FIG. 5 shows a further embodiment variant of the semiconductor element 7. In this case, a ring-shaped semiconductor element 7 having an outer circumferential area 8 and an inner circumferential area 9 is shown here. This semiconductor element 7 is suitable, in particular, for use in a tubular thermoelectric device e.g. in accordance with FIG. 4. In this case, the semiconductor element 7 is connected to the first carrier layer via a first contact area 15 and to a second carrier layer by a second contact area 16. The semiconductor element 7 furthermore has side areas 20 and also a height 13 that is formed between the inner circumferential area 9 and the outer circumferential area 8. The ring-shaped semiconductor element 7 has a current transfer area 11 on its outer circumferential area 15 and a further current transfer area on its inner circumferential area 16, which is formed by the contact with solder material 10.

Figure 6:
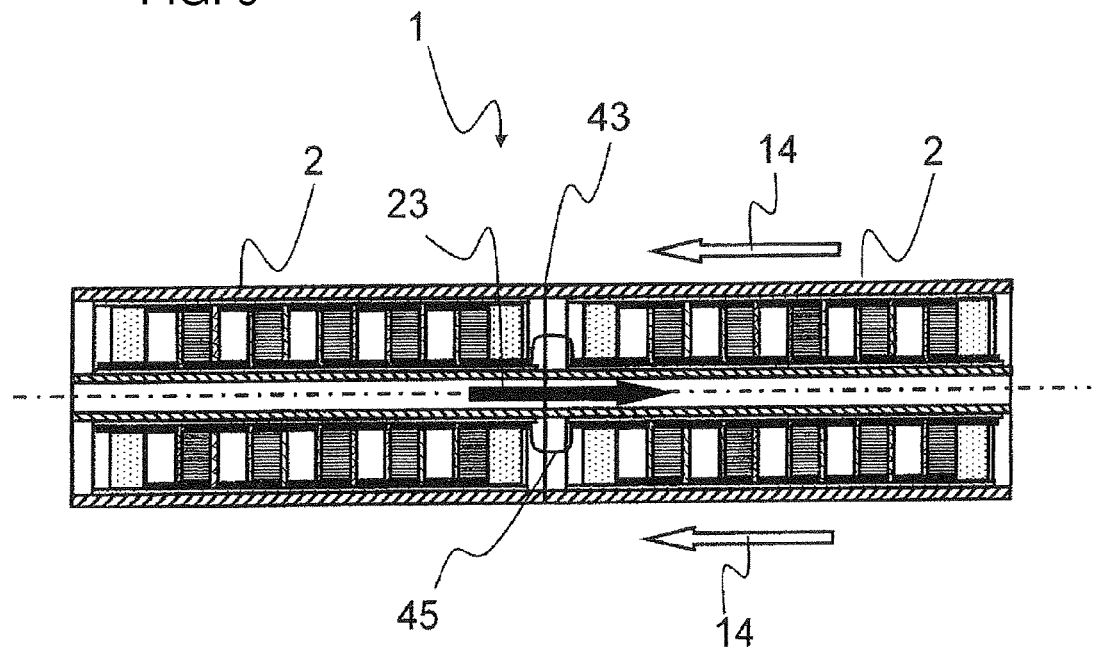
FIG. 6 is an illustration showing an embodiment variant of the thermoelectric device.

FIG. 6 shows an embodiment variant of the thermoelectric device 1, wherein a plurality of modules 2 are connected to one another by soldering connections 43 to form the thermoelectric device 1. In this case, in particular, sealing of the individual modules 2 with respect to fluids possibly having a corrosive effect is to be ensured. Here, a plurality of modules 2 are connected to form the thermoelectric device 1, such that the thermoelectric device 1 can be adapted to a wide variety of requirements with regard to the provision of electrical energy or conversion of thermal energy present into electrical energy. The individual modules 2 are electrically connected to one another via connecting devices 45, such that a series circuit formed by the semiconductor elements is also ensured via a plurality of modules 2 within the thermoelectric device 1.

Figure 7:
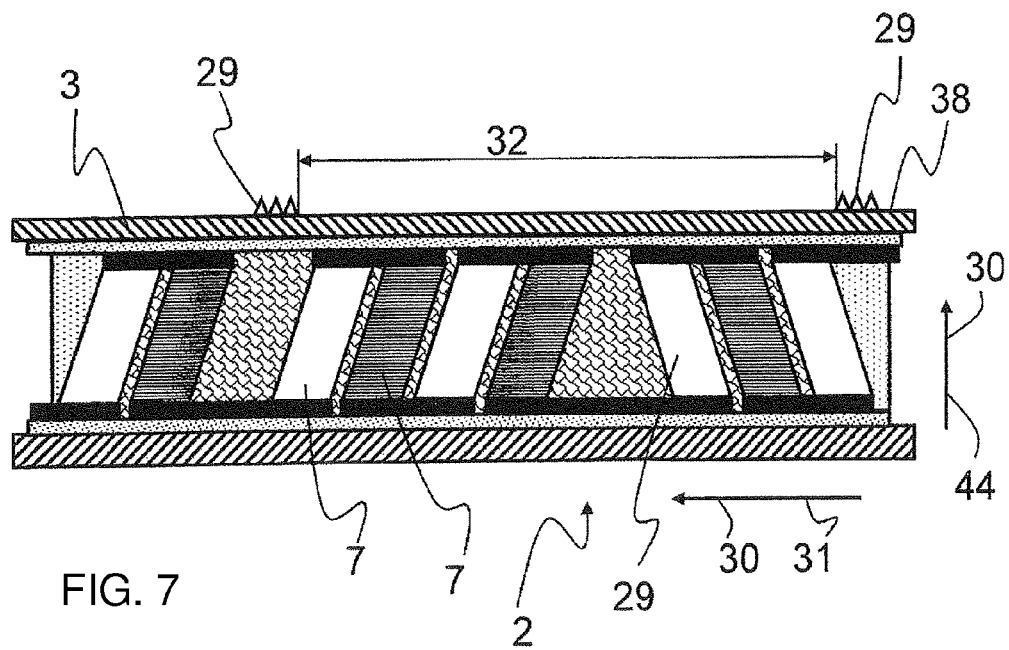
FIG. 7 is an illustration showing a detail of an embodiment variant of the module.

FIG. 7 shows a detail of a preferred embodiment variant of the module 2, wherein the semiconductor elements 7 inclined relative to an axial direction 31 are provided here, which form an axial compensation element 29, such that a thermal expansion 30 in the axial direction 31 can be at least partly converted into a thermal expansion 30 in a radial direction 44 by altering the inclination of the semiconductor elements 7. Furthermore, axial compensation elements 29 are provided on the first carrier layer 3 (hot side 38), the compensation elements being arranged at a distance 32 from one another.

The invention claimed is:

1. A thermoelectric device, comprising:
   at least one module having a first carrier layer and a second carrier layer, said first carrier layer and said second carrier layer defining an interspace therebetween; electrical insulation layers disposed on said first carrier layer and on said second carrier layer toward said interspace; and
   a plurality of p and n-doped semiconductor elements, disposed alternately in said interspace between said electrical insulation layers and said p and n-doped semiconductor elements are alternately electrically connected to one another, said p and n-doped semiconductor elements are each configured in an annular shape and having an outer circumferential area and an inner circumferential area, said p and n-doped semiconductor elements connected to said electrical insulation layers by said outer circumferential area and said inner circumferential area, said p and n-doped semiconductor elements each having current transfer areas on said outer circumferential area and on said inner circumferential area, said current transfer areas of said outer circumferential area and of said inner circumferential area of a respective one of said p and n-doped semiconductor elements have the same surface area size.

2. The thermoelectric device according to claim 1, wherein at least one of said first and second carrier layers is formed from a material containing plastic.

3. The thermoelectric device according to claim 1, further comprising a solder material, said p and n-doped semiconductor elements are electrically connected to one another by said solder material on said electrical insulation layers, and at least one of the following conditions is met:
   said solder material has a solder thickness and a ratio of a height of said semiconductor elements to said solder thickness is greater than 5:1; and
   said solder material has an element selected from the group consisting of active solder and silver solder.

4. The thermoelectric device according to claim 1, wherein said outer circumferential area and said inner circumferential area differ in size and a ratio of said outer circumferential area to said inner circumferential area is up to 3:1.

5. The thermoelectric device according to claim 1, wherein a useful volume of said module is defined as a ratio of a sum of a volume of said semiconductor elements in said module to an encapsulated volume of said module and said useful volume is greater than 90%.

6. The thermoelectric device according to claim 1, wherein said semiconductor elements have an additional electrical insulation layer on side areas facing one another, wherein said additional electrical insulation layer is formed from a material selected from the group consisting of mica and ceramic.

7. The thermoelectric device according to claim 1, wherein a ratio of a height of said semiconductor elements to an insulation layer thickness of said electrical insulation layers is greater than 8:1.

8. The thermoelectric device according to claim 1, wherein said first carrier layer has at least one axial compensation element which compensates for a thermal expansion of said module in an axial direction.

9. The thermoelectric device according to claim 1, wherein said semiconductor elements are disposed obliquely in an axial direction and define at least one axial compensation element, such that a thermal expansion of said module in an axial direction is at least partly converted into a thermal expansion in a radial direction.

10. The thermoelectric device according to claim 1, wherein said at least one module in one of a number of modules, at least a plurality of said modules can be connected to one another in an axial direction.

11. The thermoelectric device according to claim 1, wherein said p and n-doped semiconductor elements are electrically connected to one another in a form of a series circuit exclusively via said solder material.

12. A motor vehicle, comprising:
    an internal combustion engine;
    an exhaust gas system;
    a cooling circuit; and
    a plurality of thermoelectric devices each containing:
        a hot side connected to said exhaust gas system;
        a cold side connected to said cooling circuit;
        at least one module having a first carrier layer and a second carrier layer, said first carrier layer and said second carrier layer defining an interspace therebetween;
        electrical insulation layers disposed on said first carrier layer and on said second carrier layer toward said interspace;
        a plurality of p and n-doped semiconductor elements, disposed alternately in said interspace between said electrical insulation layers and said p and n-doped semiconductor elements are alternately electrically connected to one another, each of said p and n-doped semiconductor elements having an annular shape;
        said first carrier layer connected to the hot side and said second carrier layer connected to the cold side; and
        each of said p and n-doped semiconductor elements having a first contact area connected to one of said electrical insulation layers and said one of said electrical insulation layers is connected to said first carrier layer and a second contact area connected to another one of said electrical insulation layers and said another one of said electrical insulation layers is connected to said second carrier layer, said first and second contact areas having contact surfaces of different surface area sizes, said p and n-doped semiconductor elements each having current transfer areas on said first contact area and on said second contact area, said current transfer areas of said first and second contact areas of a respective one of said p and n-doped semiconductor elements being of a same surface area size.

* * * * *